United States Patent
Autti (10) Patent No.: US 7,279,979 B2
(45) Date of Patent: Oct. 9, 2007

(54) METHOD AND ARRANGEMENT FOR ADJUSTING AN OUTPUT IMPEDANCE OF A POWER AMPLIFIER

(75) Inventor: Marko Autti, Oulu (FI)

(73) Assignee: Nokia Corporation, Espoo (FI)

( * ) Notice: Subject to any disclaimer, the term of this patent is extended or adjusted under 35 U.S.C. 154(b) by 155 days.

(21) Appl. No.: 11/224,702

(22) Filed: Sep. 12, 2005

(65) Prior Publication Data

US 2007/0057728 A1 Mar. 15, 2007

(51) Int. Cl.
*H03G 3/10* (2006.01)
(52) U.S. Cl. .................. 330/285; 330/296
(58) Field of Classification Search .......... 330/285, 330/296, 302, 279, 297
See application file for complete search history.

(56) References Cited

U.S. PATENT DOCUMENTS

| | | | |
|---|---|---|---|
| 6,133,792 A * | 10/2000 | Hansson | 330/279 |
| 6,289,205 B1 | 9/2001 | Pollanen et al. | |
| 6,597,244 B2 * | 7/2003 | Tichauer | 330/298 |
| 6,643,497 B1 | 11/2003 | Kouyama | |
| 6,670,864 B2 | 12/2003 | Hyvonen et al. | |
| 7,116,173 B2 * | 10/2006 | Tsutsui et al. | 330/285 |
| 2004/0212434 A1 | 10/2004 | Nagamori et al. | |

FOREIGN PATENT DOCUMENTS

EP 1298810 4/2003

* cited by examiner

*Primary Examiner*—Henry Choe (57) ABSTRACT

The invention relates to power amplifiers having an adjustable output impedance. A power amplifier according to the invention can be used, for example, for feeding a radio frequency transmission signal into an antenna of a mobile communication device. The real part of an output impedance of a power amplifier according to the invention is matched with the real part of an impedance loading the power amplifier by adjusting an operating point of an output stage transistor 301 of the power amplifier.

23 Claims, 9 Drawing Sheets

METHOD AND ARRANGEMENT FOR ADJUSTING AN OUTPUT IMPEDANCE OF A POWER AMPLIFIER

FIELD OF THE INVENTION

The invention relates to a transmitter for communicating devices. The invention especially relates to a transmitter having a power amplifier an output impedance of which is adjustable.

BACKGROUND OF THE INVENTION

In an electrical system maximum power transfer between a load and a source is achieved when impedances of the load and the source are matched with respect to each other, which minimizes reflection losses between the load and the source. In many electrical devices the source is a power amplifier and the load can be e.g. an antenna or a line transformer. For example, in a mobile communication device an antenna impedance varies considerably with frequency and with external circumstances causing impedance mismatch between the antenna and a power amplifier feeding the antenna. An example of an external circumstance that has an effect on the antenna impedance is positions of user's fingers in the vicinity of an antenna, i.e. an 'finger effect'. In a mobile communication device an antenna impedance can vary over a wide range, characterized by a voltage standing wave ratio (VSWR) reaching up to 10:1. For a power amplifier of a transmitter, impedance mismatch has an adverse impact on power losses, maximum reachable output power, and linearity. Impedance mismatch may also change frequency responses of duplexer filters, as high-quality-value (high-Q) filters are very sensitive to changes in their load and supply impedances. Because of the above-mentioned reasons, there is a need for impedance matching between a source and a load.

DESCRIPTION OF THE PRIOR ART

Figure 1:
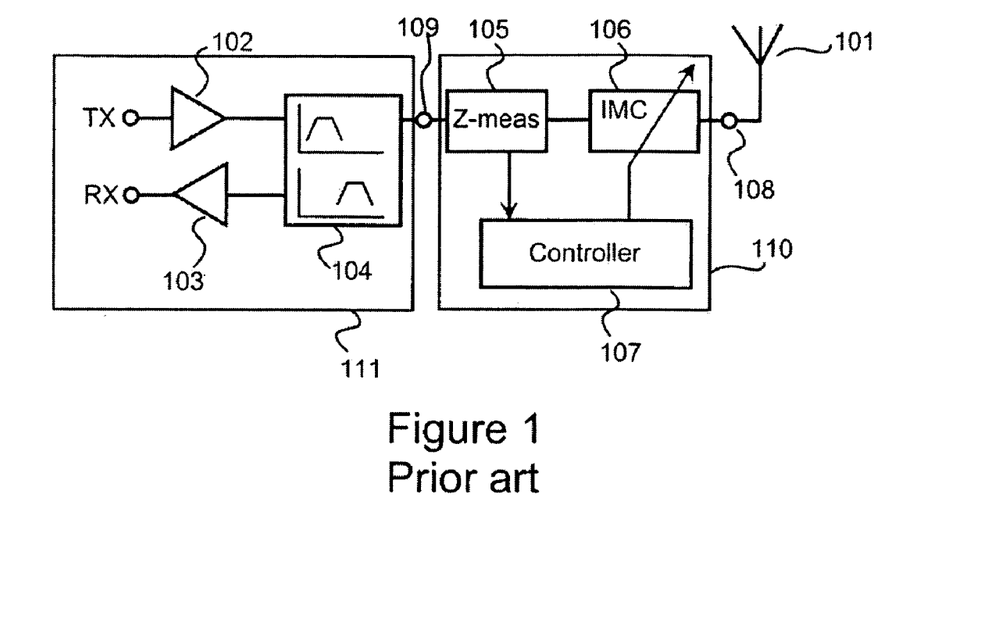
FIG. 1 shows an impedance matching system according to prior art in an exemplary application environment.

FIG. 1 shows an impedance matching system according to prior art in an exemplary application environment. The arrangement shown in FIG. 1 has a transmitter/receiver front-end 111, a tuneable impedance matching system 110, and an antenna 101. The transmitter/receiver front-end 111 has a transmitter (TX) power amplifier 102, a receiver (RX) amplifier 103, and a duplexer filter 104. The tuneable impedance matching system has a measuring circuit 105, an adjustable impedance matching circuit 106, and a controller 107. The measuring circuit 105 measures an antenna impedance, i.e. the impedance seen between a node 108 and a signal ground towards the antenna 101. During the measurement the impedance matching circuit 106 has to be either bypassed or its effect on a measured impedance value has to be compensated by post-processing when utilizing the measured impedance value. Based on the measured impedance value the controller 107 configures adjustable circuit components of the adjustable impedance matching circuit 106 to such positions that a desired impedance level is seen between a node 109 and a signal ground towards the tuneable impedance matching system 110.

A requirement for impedance matching for a system shown in FIG. 1 is such that at a matching frequency an impedance seen at the node 109 towards the impedance matching system 110 is a complex conjugate of an impedance seen at the node 109 towards the transmitter/receiver front-end 111. In more general terms, the impedance matching between two interconnected electrical systems is expressed by a requirement that the impedance towards a first electrical system has to be a complex conjugate of the impedance towards a second electrical system. In practical systems the impedances do not need to be, and in a general case they cannot be, exact complex conjugates respect to each other, but it is sufficient that an impedance mismatch between the electrical systems is below an acceptable limit. In the remainder of this document the requirement of substantially mutual conjugate impedances is called "an impedance matching condition".

Figure 2:
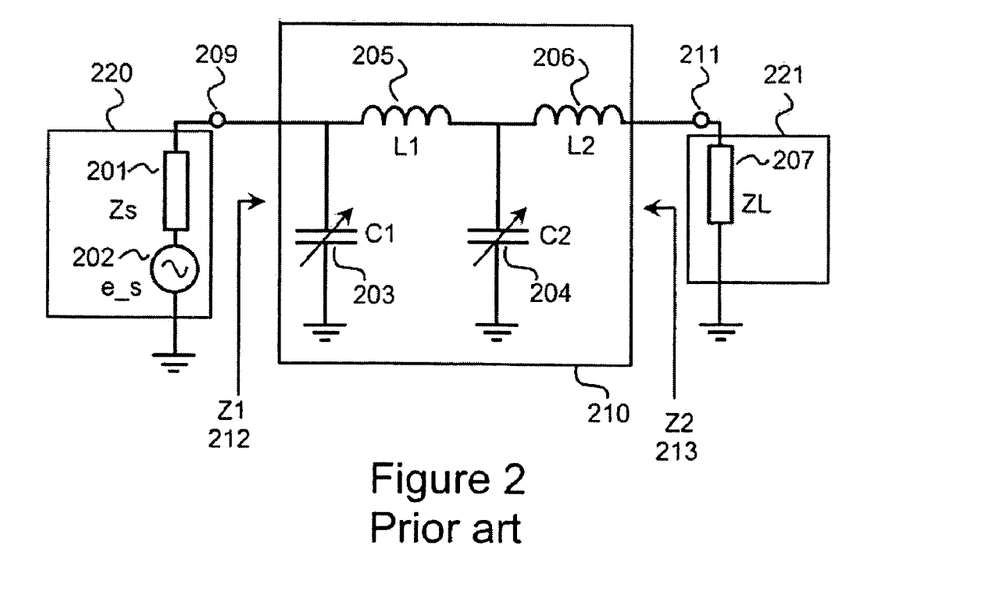
FIG. 2 shows an example circuit topology for an adjustable impedance matching circuit according to prior art.

An example circuit topology for the adjustable impedance matching circuit 106 is a cascaded L-topology shown in FIG. 2. Also a source 220, e.g. a transmitter/receiver front-end of a mobile communication device, and a load 221, e.g. an antenna of a mobile communication device, that do not belong to an adjustable impedance matching circuit 210 are presented in FIG. 2. An impedance Zs 201 represents an impedance of the source 220, an impedance ZL 207 represents an impedance of the load 221, and an ideal voltage source e_s 202 represent voltage produced by the source 220. The adjustable impedance matching circuit 210 consists of fixed value inductors 205, 206 and variable value capacitors 203, 204. A variable value capacitor can be realized with switched components, so that electrical connections of fixed value capacitors can be changed with the aid of one or more switches that can be e.g. FET-switches (Field Effect Transistor) or a variable capacitor can be a microelectromechanical (MEMS) capacitor as described in U.S. Pat. No. 6,670,864 that is incorporated herein as a reference. Variable value capacitors can also be continuously variable (varicaps).

As can be seen from FIG. 2 the topology of the adjustable impedance matching circuit 210 is rather complex. The reason for this is the fact that the adjustable impedance matching circuit 210 has to be able to match both the real and the imaginary parts of impedances on a boundary of two interconnected electrical systems. In other words, the adjustable impedance matching circuit 210 has to provide a sufficient degree of freedom. In FIG. 2 impedance matching means that an impedance Z1 212 seen from a node 209 towards the adjustable impedance matching circuit 210 is a complex conjugate of the source impedance Zs 201, i.e. Z1=Zs*. By requiring that the real parts of the impedances Z1 and Zs are equal and the imaginary parts are opposite with respect to each other we get two independent equations in which capacitance values C1 and C2 of the adjustable capacitors 203, 204 are independent variables. Said capacitance values C1 and C2 can be solved from said equations. The mathematical operations needed for solving the values of C1 and C2 are, however, quite complex. The complexity of required mathematical operations is illustrated by the equations below that correspond with a simplified situation in which the source impedance Zs 201 is assumed to be real valued. The equations for C1 and C2 are:

$$C1 = \frac{\sqrt{\frac{1}{Ra}[D1 + D2\sqrt{D3}]}}{D4}, \tag{1}$$

and $$C2 = \frac{T1 + \sqrt{T2}}{T3}, \tag{2}$$

where:

$D1=RL(\omega L1)^2+Zs(\omega L2)^2+2\omega L2XLZs+RL\ Zs^2+XL^2Zs+RL^2Zs,$ $D2=2Zs,$ $D3=RL(\omega L2)^2Zs+RL^2Zs+2\omega L2XLZs-(\omega L1)^2RL+XL^2Zs),$ $D4=Zs\omega^2L1,$ $T1=(\omega L2)^2+\omega^2L1L2+2\omega L2XL+\omega L1XL+RL^2+XL^2,$ $T2=(\omega L2)^2RLZs+RL^3Zs+2\omega L2XLRLZs-(\omega L1)^2RL^2+XL^2RL^2,$ $T3=\omega^2L1(\omega L2)^2+XL^2+RL^22+\omega L2XL),$ where $\omega$ is $2\pi\times$ frequency at which the impedance matching is performed, and RL and XL are the real and imaginary parts of the load impedance ZL 207 at that frequency. When the values C1 and C2 obtained from equations (1) and (2) are given to capacitors 203 and 204 the impedance 212 seen between the node 209 and the signal ground towards the impedance matching circuit 210 has same value as the impedance 201, i.e. Z1=Zs (Zs is assumed to be real valued, i.e. Zs=Zs*).

A complex topology of an adaptive impedance matching circuit means a relatively high number of components like inductors and capacitors. Each component means costs, a need for space, and power losses. Many times at least inductors have to be realized as discrete components meaning also an increase in the number of components to be assembled in a production line. The complexity of mathematical operations associated with impedance matching is an awkward issue especially when impedance matching is intended to be performed at successive time instants with a short interim time period in order to be able to follow changing conditions, e.g. temporal variation of an impedance of an antenna of an mobile communication device. The processing capacity needed for the mathematics means costs, a need for space, and a need for power.

BRIEF DESCRIPTION OF THE INVENTION

It is an objective of the present invention to provide a transmitter having a power amplifier the output impedance of which can be matched with a load impedance so that the limitations and drawbacks associated with prior art are eliminated or reduced. It is also an object of the present invention to provide a mobile communication device having a power amplifier the output impedance of which can be matched with a load impedance so that the limitations and drawbacks associated with prior art are eliminated or reduced. It is also an object of the present invention to provide a set of integrated circuits (chip-set) that can be used e.g. in a mobile communication device so that the limitations and drawbacks associated with prior art are eliminated or reduced. It is also an object of the present invention to provide a method for matching an output impedance of a power amplifier with a load impedance so that the limitations and drawbacks associated with prior art are eliminated or reduced.

The objectives of the invention are achieved with a solution in which the real part of an output impedance of a power amplifier is matched with the real part of a load impedance by adjusting an operating point of an output stage transistor of the power amplifier, or output stage transistors in a case of a two-sided power amplifier like a push-pull power amplifier.

The invention yields appreciable benefits compared to prior art solutions:

There is no need for a separate impedance matching circuit in applications where a sufficient quality of impedance matching can be reached by matching only the real part of an output impedance of a power amplifier with the real part of a load impedance, an impedance matching circuit for matching only the imaginary part of an output impedance of a power amplifier with the imaginary part of a load impedance is significantly simpler than an impedance matching circuit capable of matching both the real and the imaginary parts, complexity of mathematical operations associated with impedance matching is reduced, due to the above mentioned advantages power losses, required space, and costs of a system comprising a power amplifier an output impedance of which is to be matched with a load impedance are reduced.

A transmitter according to the invention for communication devices is characterized in that the transmitter comprises:

a power amplifier having at least one output stage transistor coupled between a signal input interface of the power amplifier and a signal output interface of the power amplifier, control means disposed to adjust an operating point of the output stage transistor to optimize impedance match between an output impedance of the power amplifier and an impedance that is loading the signal output interface of the power amplifier, and controllable gain unit disposed to substantially compensate variations in a gain of the output stage transistor caused by changes in the operating point of the output stage transistor.

A mobile communication device according to the invention is characterized in that it comprises:

a power amplifier having at least one output stage transistor coupled between a signal input interface of the power amplifier and a signal output interface of the power amplifier, control means disposed to adjust an operating point of the output stage transistor to optimize impedance match between an output impedance of the power amplifier and an impedance that is loading the signal output interface of the power amplifier, and controllable gain unit disposed to substantially compensate variations in a gain of the output stage transistor caused by changes in the operating point of the output stage transistor.

A set of integrated circuits according to the invention for constructing a transmitter is characterized in that the set of integrated circuits comprises the following elements in one or more integrated circuit:

a power amplifier having at least one output stage transistor between a signal input interface of the power amplifier and a signal output interface of the power amplifier, control means disposed to adjust an operating point of the output stage transistor to optimize impedance match between an output impedance of the power amplifier and an impedance that is loading the signal output interface of the power amplifier, and controllable gain unit disposed to substantially compensate variations in a gain of the output stage transistor caused by changes in the operating point of the output stage transistor.

A method according to the invention for matching an output impedance of a power amplifier with an impedance that is loading a signal output interface of the power amplifier is characterized in that it comprises:

adjusting an operating point of an output stage transistor of the power amplifier to optimize impedance match between the output impedance of the power amplifier and the impedance that is loading the signal output interface of the power amplifier, and compensating at least partly a change in a gain of the output stage transistor caused by a change in the operating point of the output stage transistor by adjusting power of an input signal of the power amplifier.

Features of various advantageous embodiments of the invention are described below.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in the sense of examples and with reference to the accompanying drawings, in which.

DETAILED DESCRIPTION OF THE PREFERRED EMBODIMENTS OF THE INVENTION

FIGS. 1-2 have been explained above in the description of the prior art.

Figure 3A:
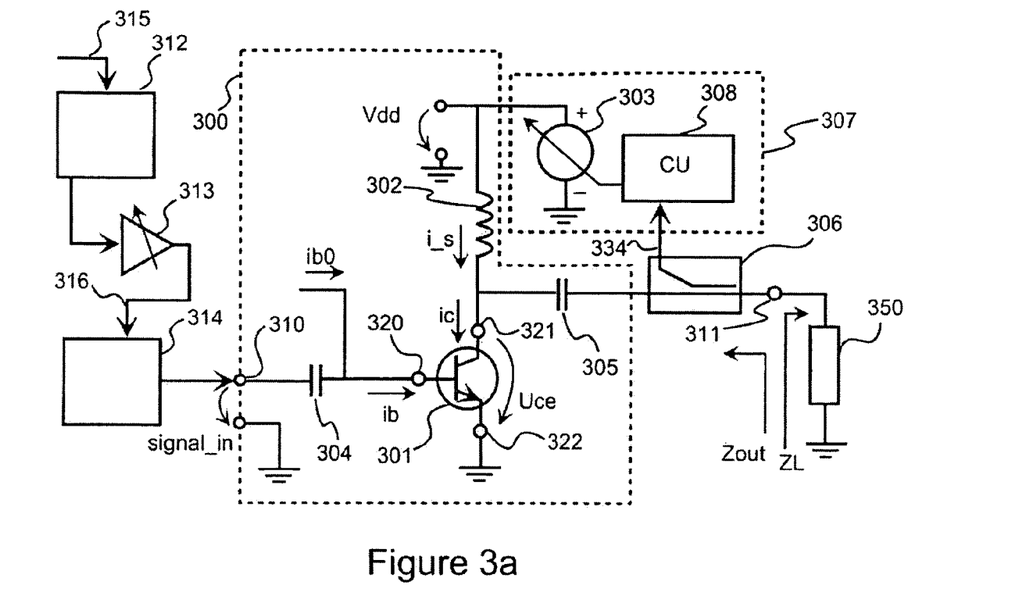
FIGS. 3a, 3b, 3c, and 3d show transmitters according to embodiments of the invention.

FIG. 3a shows a transmitter according to an embodiment of the invention. In this embodiment the power amplifier 300 of the transmitter has a single-ended output stage having one bipolar output stage transistor 301. A block 350 represents parts of the transmitter that are loading the power amplifier 300. The block 350 can comprise e.g. a duplexer, an antenna front end, and an antenna. The block 350 is coupled to a signal output interface 311 of the power amplifier 300. The power amplifier receives an input signal at a signal input interface 310. The signal input interface 310 is coupled to a base 320 of the output stage transistor 301 via a dc-decoupling capacitor 304. The base is also fed with dc-current ib0 that partly determines an operating point of the output stage transistor 301. The operating point of the output stage transistor is also determined by supply dc-voltage Vdd that is coupled to a collector 321 of the output stage transistor via an ac-decoupling inductor 302. An emitter 322 of the output stage transistor is connected to a signal ground. In the continuation of this document the dc-current ib0 is called operating point base current and a dc-component of collector-emitter voltage Uce that substantially equals the supply dc-voltage Vdd is called operating point collector-emitter voltage Uce0. If no input signal is received at the signal input interface 310 base current ib equals the operating point base current ib0 and the collector-emitter voltage Uce equals the operating point collector-emitter voltage Uce0. When an input signal is received an operational state of the output stage transistor 301 deviates from the operation point according to a value of the RF-input signal.

The collector 321 of the output stage transistor is coupled to a signal output interface 311 via a dc-decoupling capacitor 305 and via sensor means 306. The sensor means are disposed detect impedance mismatch between an output impedance Zout of the power amplifier and an input impedance ZL of the block 350 coupled to the signal output interface 311. The sensor means 306 can be any arrangement that is able to detect impedance mismatch, for example, a directional switch that is able to separate a signal flowing towards the block 350 from a signal that has been reflected back at the signal output interface 311 due to mismatch between the output impedance Zout and the input impedance ZL. A result 334 indicating possible impedance mismatch is fed into control means 307 that are disposed to optimize impedance match between an output impedance Zout of the power amplifier and the input impedance ZL by adjusting the operating point of the output stage transistor 301. In this embodiment the result 334 delivered by the sensor means 306 constitutes information according to which the control means 307 optimize the impedance match. The control means 307 comprise a control unit 308 and a controllable voltage source 303. The controllable voltage source 303 generates the supply dc-voltage Vdd, i.e. the operating point collector-emitter voltage Uce0. The operating point of the output stage transistor is adjusted by tuning a value of the supply dc-voltage Vdd so that the impedance match between the output impedance Zout and the input impedance ZL is optimized. The operating point that corresponds with the optimal impedance match is the operating point in which power of a signal reflected back at the signal output interface 311 and detected e.g. with a directional switch has its smallest value in proportion to a signal that flows towards the block 350. The controllable voltage source 303 can be realized e.g. as a switched-mode power supply unit.

According to another embodiment of this invention the operating point of the output stage transistor 301 is adjusted by tuning a dc-component of supply current i_s of the power amplifier 300, i.e. the dc-component of collector current ic. In practice, however, it is more complicated to adjust the operating point by tuning the dc-component of the supply current than by tuning the supply dc-voltage Vdd, because a relatively small change in the dc-component of the collector current ic causes a relatively big change in the operating point collector-emitter voltage.

The optimal operation point can be searched e.g. with the following algorithm based on a damped directed search method:
- start of the algorithm: measure impedance mismatch when the supply dc-voltage has its starting value Vdd,
- phase 1: measure impedance mismatch when the supply dc-voltage=Vdd+ΔU and when the supply dc-voltage=Vdd−ΔU,
- phase 2: set the supply dc-voltage to the value from the group {Vdd, Vdd+ΔU, Vdd−ΔU} that gives the best impedance match,
- phase 3: determine a directed search step S as follows:
  - if new Vdd=previous Vdd+ΔU set S=ΔU,
  - if new Vdd=previous Vdd−ΔU set S=−ΔU,
  - if no change in Vdd and ΔU is greater than a predetermined limit (ΔU>ε) go to phase 1 with a new ΔU that is smaller (damping) than the previously used ΔU,
  - if no change in Vdd but ΔU is not greater than the predetermined limit the optimal supply dc-voltage is the prevailing Vdd and the search has been completed, i.e. end of the algorithm,
- phase 4: Update supply dc-voltage with S (new Vdd=previous Vdd+S) and measure impedance mismatch repeatedly as long as impedance match gets better,
- phase 5: if ΔU is greater than a predetermined limit (ΔU>ε) go to phase 1 with a new ΔU that is smaller than the previously used ΔU, but if ΔU is not greater than the predetermined limit the optimal supply dc-voltage is the prevailing Vdd and the search has been completed, i.e. end of the algorithm.

When the operating point of the output stage transistor 301 is changed also the gain of the output stage transistor 301 is changed leading to a change in output power of the power amplifier. In many cases the change in the output power is a harmful side effect of impedance matching according to the invention. Therefore, the change in the gain of the output stage transistor 301 due to impedance matching has to be compensated. The compensation is performed with a controllable gain unit 313. The compensation can be performed in various places in the transmitter according to an embodiment of the invention. For example, in a transmitter used in a mobile communication device it is possible to amplify or attenuate a base band signal with a compensation gain, i.e. before up-modulation. In this case the compensation does not have to be able to handle high-frequency RF signals. In certain mobile communication devices according to an embodiment of the invention a base band signal is available also in a digital form. In this kind of case the compensation can be performed with digital signal processing means. The controllable gain unit is controlled in a way that output power fed into the block 350 by the power amplifier 300 is substantially kept in its reference value P_ref when the operating point of the output stage transistor 301 is changed. In this document the reference value of the output power P_ref is assumed to be an externally given control parameter of the transmitter. The output power can be measured e.g. by using a directional switch. In many cases the sensor means 306 that are used for detecting impedance mismatch can also be used for providing controlling information for the controllable gain unit 313. The controllable gain unit 313 can be e.g. a variable gain amplifier (VGA). A device that controls the controllable gain unit 313 can be integrated into the control unit 308. The controllable gain unit 313 can be controlled for example with the following algorithm:
- start of the algorithm: go to step 1 if the operating point of the output stage transistor has been changed,
- step 1: measure output RF-power=P_meas,
- step 2: calculate difference Δ=P_meas−P_ref,
- step 3: increase gain of the controllable gain unit if Δ<−ε and go to step 1, decrease gain of the controllable gain unit if Δ>ε and go to step 1, end of algorithm if −ε<Δ<ε, where (ε>0) is a predetermined limit.

The algorithm for controlling the controllable gain unit 313 is performed preferably, but not necessarily, after every change in the operating point.

As mentioned above the controllable gain unit 313 can be located in different places of the transmitter. A block 312 represent parts of the transmitter that perform signal processing before the controllable gain unit 313 and a block 314 represents parts of the transmitter that perform signal processing between the controllable gain unit 313 and the signal input interface 310 of the power amplifier. A signal 315 represents information that is to be transmitted. For example, if the compensation is performed to an analog base band signal the block 314 may comprise an up-modulator. The block 312 comprises a digital-to-analog converter if the input signal 315 is in a digital form. As another example, the compensation can be performed at the signal input interface 310 of the power amplifier. In this case an output signal 316 of the controllable gain unit 313 is coupled directly to the signal input interface 310 of the power amplifier.

The control unit 308 can be realized with a programmable processor plus a software product stored on a readable medium for execution by the processor, the software product comprising software means for performing the above-described mathematical operations. As another option the control unit can be realized with one or more dedicated circuits that is/are designed to perform the above-mentioned operations. In this case electrical connections between logic ports and other elements of a circuit form the intelligence that controls the operations. A dedicated circuit can be e.g. an application specific integrated circuit (ASIC). The control unit can also be realized with one or more field programmable gate array (FPGA) components. An FPGA component is configured before its operation with configuration software to emulate a dedicated circuit. Furthermore, the control unit can be a hybrid construction comprising at least two from the following list: a programmable processor plus a corresponding software product, a dedicated circuit, a field programmable gate array component plus appropriate configuration software.

Figure 3B:
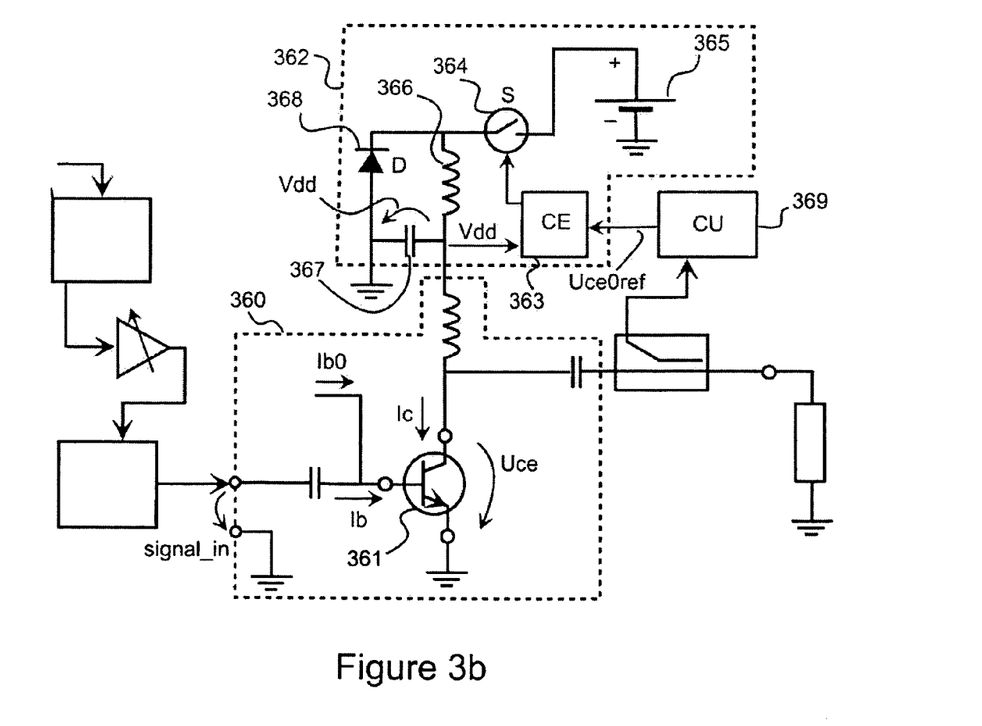

FIG. 3b shows a transmitter according to an embodiment of the invention. In this embodiment of the invention a controllable voltage source that generates supply dc-voltage Vdd for a power amplifier 360 is a switched-mode power supply unit 362. The switched-mode power supply unit 362 comprises a control element 363, a switch element 364, a dc-voltage source 365, a filter inductor 366, a filter capacitor 367, and a freewheeling diode 368. The control element 363 receives a desired value of collector-emitter operating point voltage Uce0ref from a control unit 369 that corresponds with the control unit 308 in the embodiment shown in FIG. 3a. The control element 363 controls the switch element 364 so that output voltage Vdd of the switched-mode power supply unit 362 equals the desired collector-emitter operating point voltage Uce0ref.

Figure 3C:
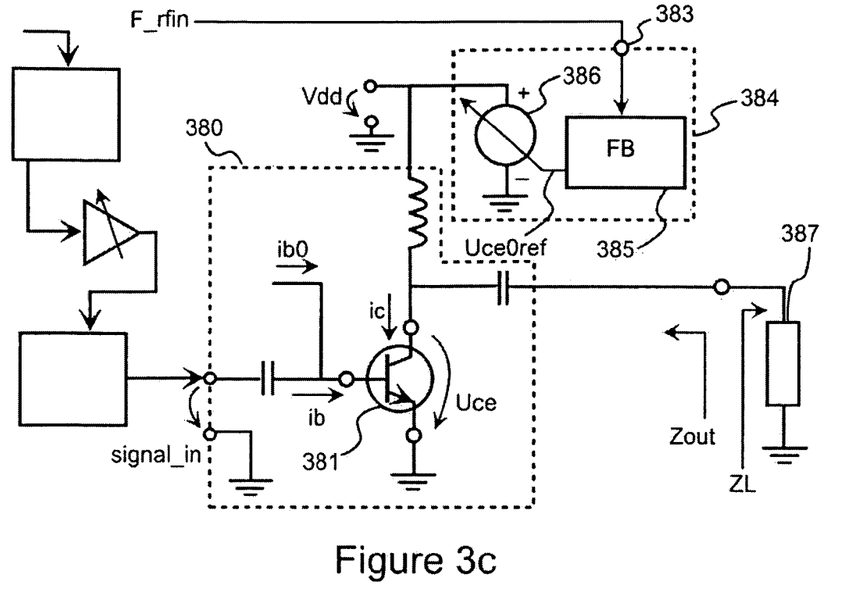

FIG. 3c shows a transmitter according to an embodiment of the invention. Control means 384 are disposed to optimize impedance match between an output impedance Zout of a power amplifier 380 and an input impedance ZL of parts 387 of the transmitter that are loading the power amplifier 380 by adjusting an operating point of an output stage transistor 381. The control means comprise a controllable voltage source 386 that produces supply dc-voltage Vdd and a function element 385 from which a desired value of the operating point collector-emitter voltage Uce0ref is obtained. An input for the function element 385 is constituted by one or more quantities F_rfin that contain information about frequency band occupied by an input signal that is received at a signal input interface of the power amplifier. In the continuation, the information about frequency band F_rfin is called frequency band information. For example, F_rfin can be a value of a center frequency of the frequency band. In this embodiment of the invention the frequency band information F_rfin constitute information according to which the control means 384 optimize the impedance match. The frequency band information F_rfin is received at the control input interface 383. The operation of the control means 384 is based on the fact the frequency band information characterizes the input impedance ZL satisfactorily well in many applications, e.g. an antenna impedance of a mobile communication device is characterized with a certain accurateness by a value of the center frequency. Therefore, a function that returns a suitable operating point collector-emitter voltage value for e.g. a given value of the center frequency can be constructed. It is also possible to construct functions that have more than one argument e.g. the center frequency and the width the frequency band. Straightforward implementations for this function are a lookup table and a mathematical equation having adjustable parameters. An inherent limitation of this kind of control means is the fact that the impedance matching is not able to follow such changes of the input impedance ZL that are caused by external effects like e.g. a "finger effect" in conjunction with a mobile phone.

Figure 3D:
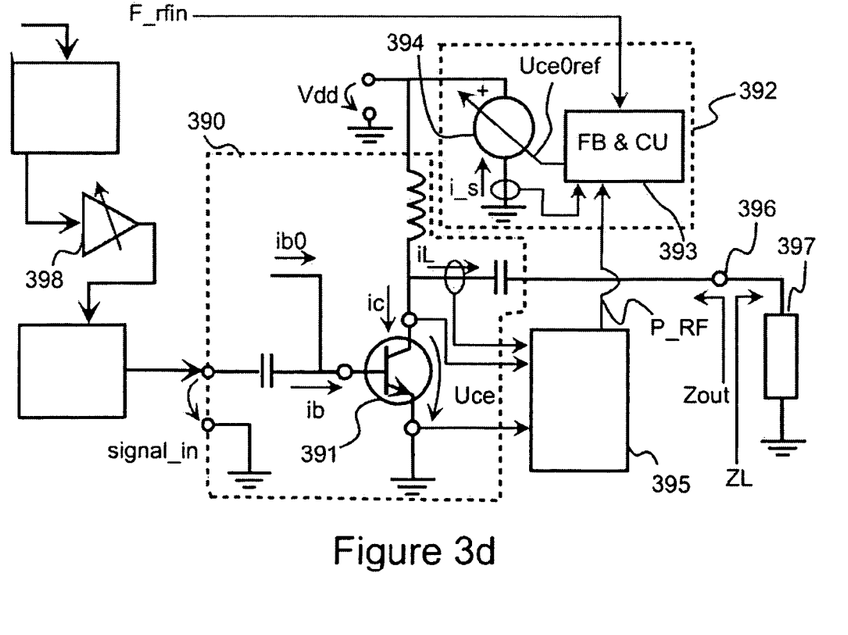

FIG. 3d shows a transmitter according to an embodiment of the invention. Information according to which control means 392 optimize impedance matching is represented by both frequency band information F_rfin and a result P_RF measured by sensor means 395 from an output signal of a power amplifier 390. This kind of arrangement enables a coarse/fine impedance matching. The coarse matching is based on the frequency band information F_rfin and the fine matching is based on the result P_RF. The result P_RF represents output power of the power amplifier 390 delivered via a signal output interface 396 of the power amplifier. A control unit 393 measures supply power Ps that is supplied by a controllable voltage source 394. The supply power is Ps=Vdd*i_s, where Vdd is supply dc-voltage, i.e. operating point collector-emitter voltage, and i_s is current supplied by the controllable voltage source 394. When an output impedance Zout of the power amplifier 390 is matched with an input impedance ZL of parts 397 loading the power amplifier 390 the ratio of the output power to the supply power (P_RF/Ps) is maximized. Therefore, the ratio P_RF/Ps can be used as a criterion according to which an optimal operating point can be searched for an output stage transistor 391. The optimal operating point can be searched e.g. using the damped directed search method that was described in conjunction with the embodiment of the invention shown in FIG. 3a. The output power P_RF can be measured for example with an arrangement described in U.S. Pat. No. 6,289,205 that is incorporated herein as a reference. The measured output power P_RF can be used also as control information for a controllable gain unit 398. The controllable gain unit 398 is controlled in a way that the measured output power P_RF is kept substantially in its reference value P_ref when the operation point of the output stage transistor 391 is changed.

Figure 4A:
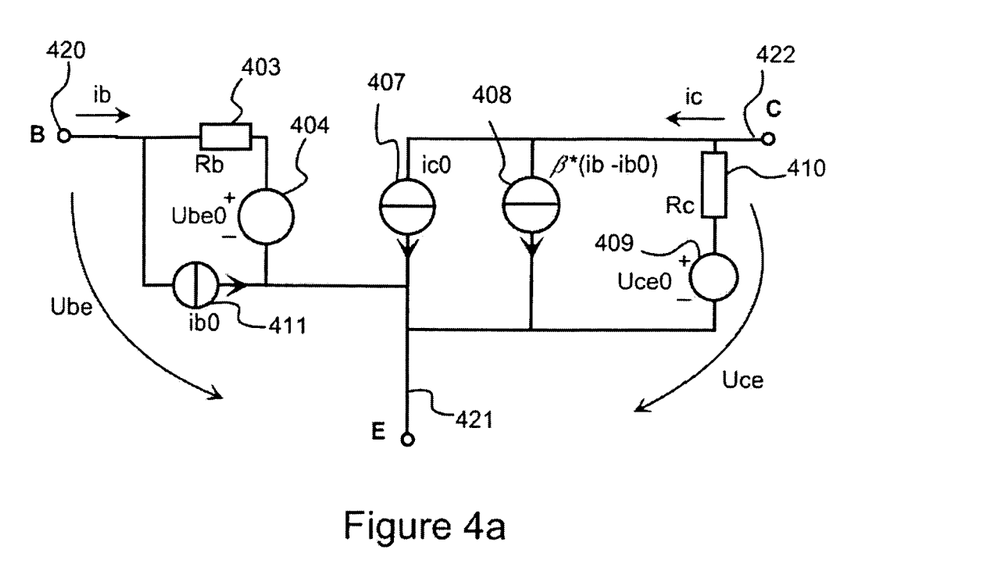
FIG. 4a and 4b show linearized models for a bipolar output stage transistor of a power amplifier and for a FET-type output stage transistor of a power amplifier, according to the invention.

The principle according to the invention for adjusting the real part of an output impedance of a power amplifier by adjusting an operating point of an output stage transistor is illustrated below with the aid of FIGS. 4a, 4b and 5. FIG. 4a presents a linearized model for a bipolar output stage transistor. In this model voltage Ube between a base 420 and an emitter 421 is expressed as:

$$Ube = Ube0 + Rb*(ib-ib0),$$

where Ube0 is voltage 404 between the base and the emitter in the operating point (operating point base-emitter voltage), ib is base current (ib in FIG. 3a), ib0 is operating point base current 411 (ib0 in FIG. 3a), and Rb is a dynamical resistance 403 evaluated in the operating point, i.e.

$$Rb = \frac{\partial Ube}{\partial ib}$$

in the operation point, i.e. ib=ib0.

Collector current ic flowing into a collector 422 of the output stage transistor (ic in FIG. 3a) is expressed as $$ic = ic0 + \beta*(ib-ib0) + (Uce-Uce0)/Rc,$$

where ic0 is the collector current 407 in the operating point, coefficient β of the current source 408 is a current amplification coefficient of the output stage transistor evaluated in the operating point, i.e.

$$\beta = \frac{\partial ic}{\partial ib}$$

in the operation point, i.e. ib=ib0,

Uce is collector-emitter voltage, Uce0 is the operating point collector-emitter voltage 409, and Rc is a dynamical resistance 410 evaluated in the operating point, i.e.

$$Rc = \frac{1}{\partial ic/\partial Uce}$$

in the operation point, i.e. Uce=Uce0.

From FIG. 4a we can see that the real part of the output impedance of the output stage transistor in FIGS. 3a and 3b is Rc.

Figure 4B:
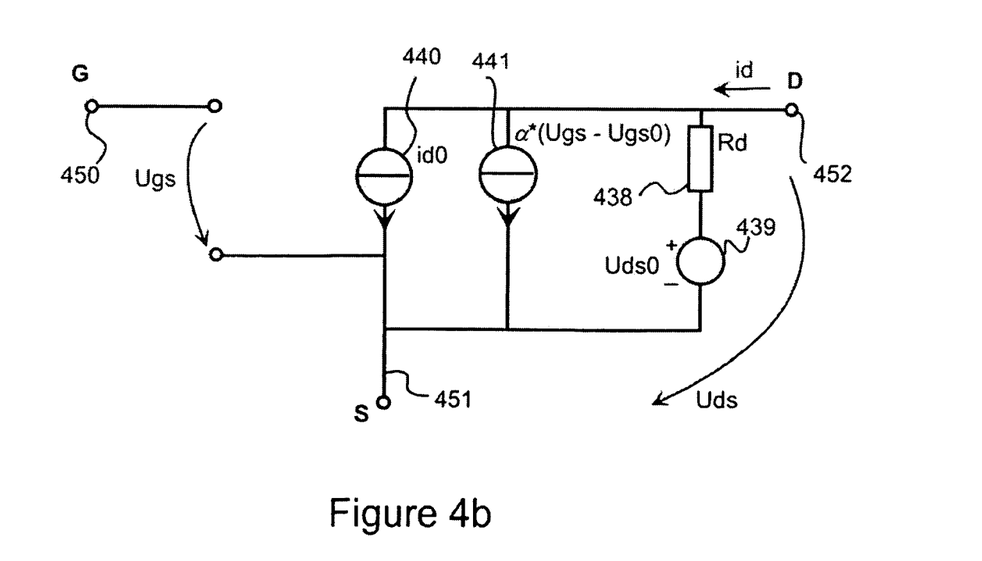

FIG. 4b presents a corresponding model for a FET-type output stage transistor. In a power amplifier an input signal in delivered to a gate 450 (corresponding with a base), a source 451 (corresponding with an emitter) is connected to a signal ground, and an output signal is taken out from a drain 452 (corresponding with a collector). From FIG. 4a we can see that the real part of an output impedance of a FET-type output stage transistor is Rd that is a dynamical resistance 438 evaluated in the operating point, i.e.

$$Rd = \frac{1}{\partial id / \partial Uds}$$

in the operation point, i.e. Uds=Uds0, where id is drain current, Uds is drain-source voltage, and Uds0 is operating point drain-source voltage 439. In FIG. 4b current id0 is drain current 440 in the operation point and α is a voltage-to-current [A/V] amplification coefficient (transconductance 441) in the operation point.

The models shown in FIGS. 4a and 4b are simplified in a sense that all energy-storing elements have been omitted like junction and wiring capacitances and wiring inductances.

Figure 5:
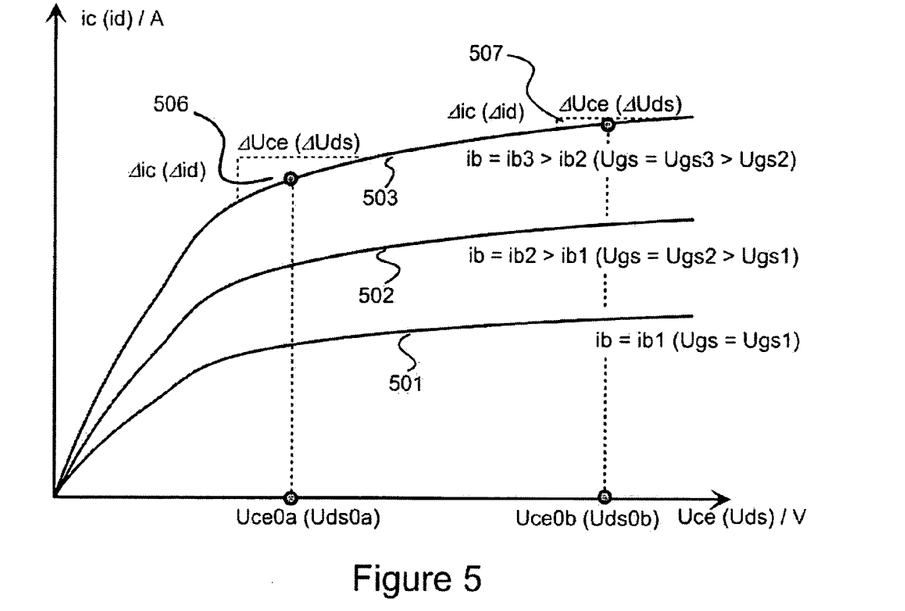
FIG. 5 shows principled characteristic curves of an output stage transistor of a power amplifier, according to the invention.

FIG. 5 shows principled characteristic curves of an output stage transistor of a power amplifier. In a case of a bipolar transistor the figure presents collector current ic as a function of base current ib and collector-emitter voltage Uce. The function is illustrated with three curves 501, 502, and 503 corresponding with three different values of base current (ib=ib1, ib=ib2, ib=ib3), respectively. In a case of a FET-type transistor the figure presents drain current id as a function of gate-source voltage Ugs and drain-source voltage Uds. The three curves 501, 502, and 503 correspond with three different values of gate-source voltages (Ugs=Ugs1, Ugs=Ugs2, Ugs=Ugs3), respectively. Quantities corresponding with a FET-type transistor are shown in parentheses in FIG. 5.

From FIG. 5 we can see that the slope Δic/ΔUce (Δid/ΔUgs) of the curves 501, 502, and 503 decreases when the collector-emitter (drain-source) voltage is increased. For example, a slope value at point 507 that corresponds with the operating point collector-emitter voltage Uce0b (drain-source voltage Uds0b) is smaller than the slope value at point 506 that corresponds with the operating point collector-emitter voltage Uce0a (drain-source voltage Uds0a). This means that the real part of an output impedance, i.e. an inverse of the slope ΔUce/Δic (ΔUgs/Δid), increases when the operating point collector-emitter voltage (the drain-source voltage) is increased. In transistors that are suitable for a power amplifier of a mobile communication device the real part R of an output impedance is approximately directly proportional to a square of the operating point collector-emitter voltage (drain-source voltage), i.e. R~Uce0² (R~Uds0²). An optimum value Ropt for the real part R of the output impedance is Ropt=Uce0²/2Po (Ropt=Uds0²/2Po), where Po is an output power of a power amplifier.

Figure 6:
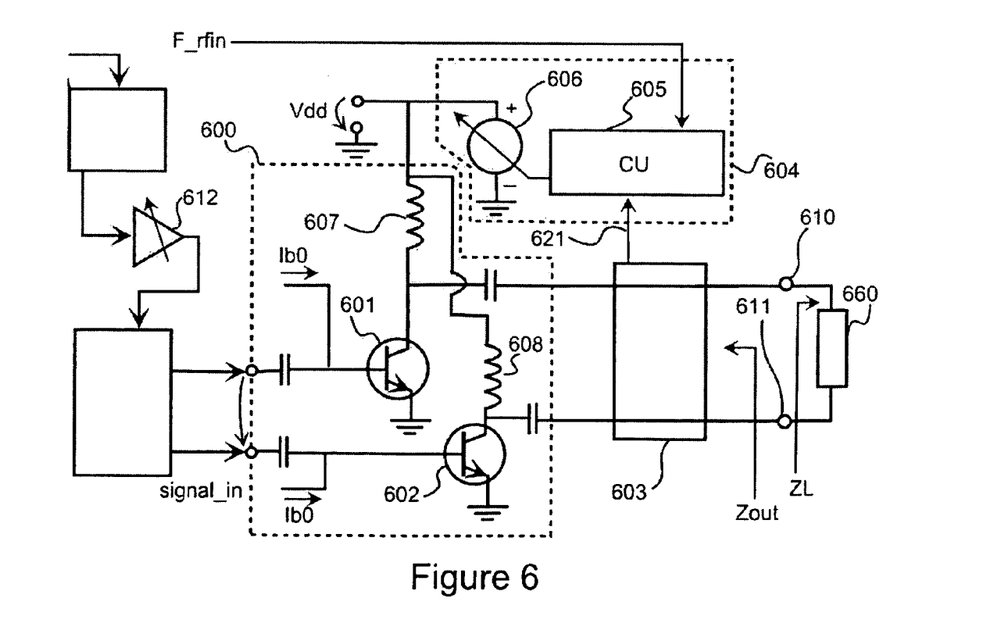
FIG. 6 shows a transmitter having a push-pull type power amplifier according to an embodiment of the invention.

FIG. 6 shows a transmitter according to an embodiment of the invention comprising a power amplifier 600 having a push-pull type output stage. In this embodiment an output impedance of the power amplifier Zout seen at a signal output interface, terminals 610 and 611, towards the power amplifier is a serial connection of output impedances of output stage transistors 601 and 602. The transmitter comprises sensor means 603 that can be e.g. a directional switch or an arrangement that was described in conjunction with the embodiment of the invention shown in FIG. 3d. A measurement result 621 is fed into control means 604 that are disposed to optimize impedance match between an output impedance Zout of the power amplifier and an input impedance ZL of parts 660 connected to a signal output interface the power amplifier by adjusting the operating point of the output stage transistors 601 and 602. In this embodiment the measurement result 621 or frequency band information F_rfin or both of them constitute information according to which the control means 604 optimize the impedance match. The control means 604 comprise a control unit 605 and a controllable voltage source 606. The controllable voltage source 606 generates supply dc-voltage Vdd, i.e. determines operating point collector-emitter voltage. The controllable voltage source 606 can be e.g. a switched-mode power supply unit. The supply dc-voltage Vdd is coupled to collectors of the output stage transistors 601 and 603 via ac-decoupling inductors 607 and 608.

Operating point of the output stage transistors is adjusted by tuning a value of the supply dc-voltage Vdd so that the impedance match between the output impedance Zout and the input impedance ZL is optimized. The operating point that corresponds with the optimum impedance match is the operating point in which power of a signal reflected back at the signal output interface and detected e.g. with a directional switch has its smallest value in proportion to a signal that flows towards the parts 660. The optimal operating point can be searched e.g. using the damped directed search method that was described in conjunction with the embodiment of the invention shown in FIG. 3a. A controllable gain unit 612 compensates changes in gains of the output stage transistors 601 and 602 caused by changes in the operation point of the output stage transistors.

Figure 7A:
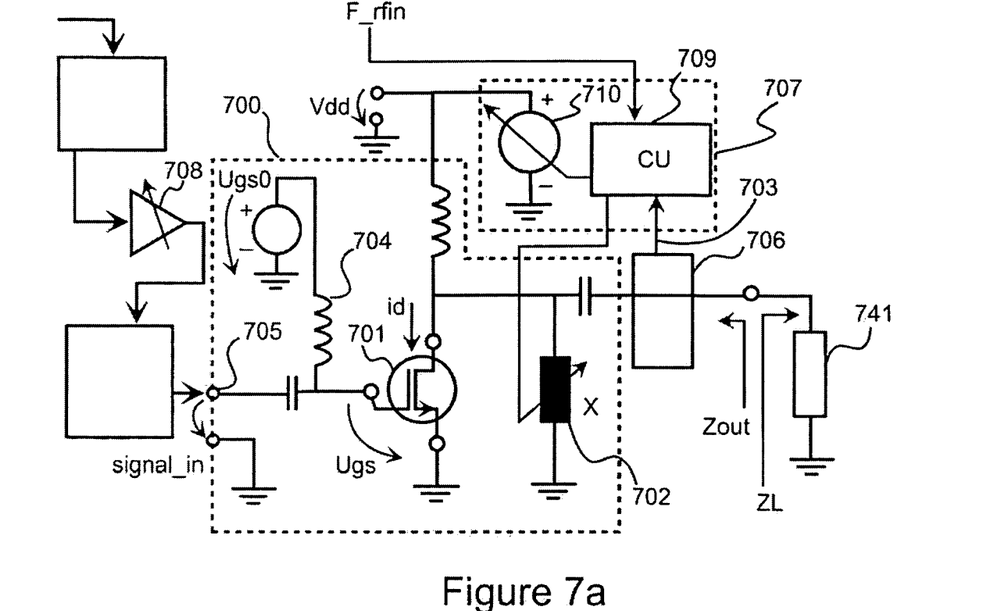
FIGS. 7a and 7b show transmitters having an adjustable reactance element according to embodiments of the invention.

FIG. 7a shows a transmitter according to an embodiment of the invention. In this embodiment of the invention an output stage transistor 701 of a power amplifier 700 is a FET-type transistor. Operating point gate-source voltage Ugs0, is coupled to a gate of the output stage transistor 701 via an ac-decoupling inductor 704. The power amplifier 700 receives an input signal at a signal input interface 705. The transmitter comprises sensor means 706 that can be e.g. a directional switch or an arrangement that was described in conjunction with the embodiment of the invention shown in FIG. 3d. In this embodiment of the invention impedance match between an output impedance Zout of the power amplifier and an input impedance ZL of parts 741 loading the power amplifier is optimized by adjusting supply dc-voltage Vdd, i.e. operating point drain-source voltage, and by adjusting a value of an adjustable reactance element 702 that is coupled between a signal output terminal of the output stage transistor 701 and a signal ground. Control means 707 comprise a controllable voltage source 710 that produces the supply dc-voltage Vdd and a control unit 709 that is disposed to find an optimal value for the supply dc-voltage Vdd and an optimal value for the adjustable reactance element 702. Information according to which the optimization is performed can be a result 703 measured by the sensor means 706 from output signal of the power amplifier or frequency band information F_rfin or both of them. A controllable gain unit 708 compensates changes in a gain of the output stage transistor 701 caused by changes in the operation point of the output stage transistors.

The optimization can be carried out for example with the following two-step procedure. In the first step the value of the adjustable reactance element is kept fixed and the supply dc-voltage Vdd is optimized by using e.g. the damped directed search method that was described in conjunction with the embodiment shown in FIG. 3a, and in the second step the supply dc-voltage Vdd is kept in the value found in the first step and an optimal value is searched for the adjustable reactance element. This kind of procedure is based on an assumption that the optimal supply dc-voltage Vdd and the optimal value for the adjustable reactance element are independent of each other. If this assumption is not valid with a sufficient accuracy the above described two-step procedure can be repeated a desired number of times thus leading to an iterative process.

Figure 7B:
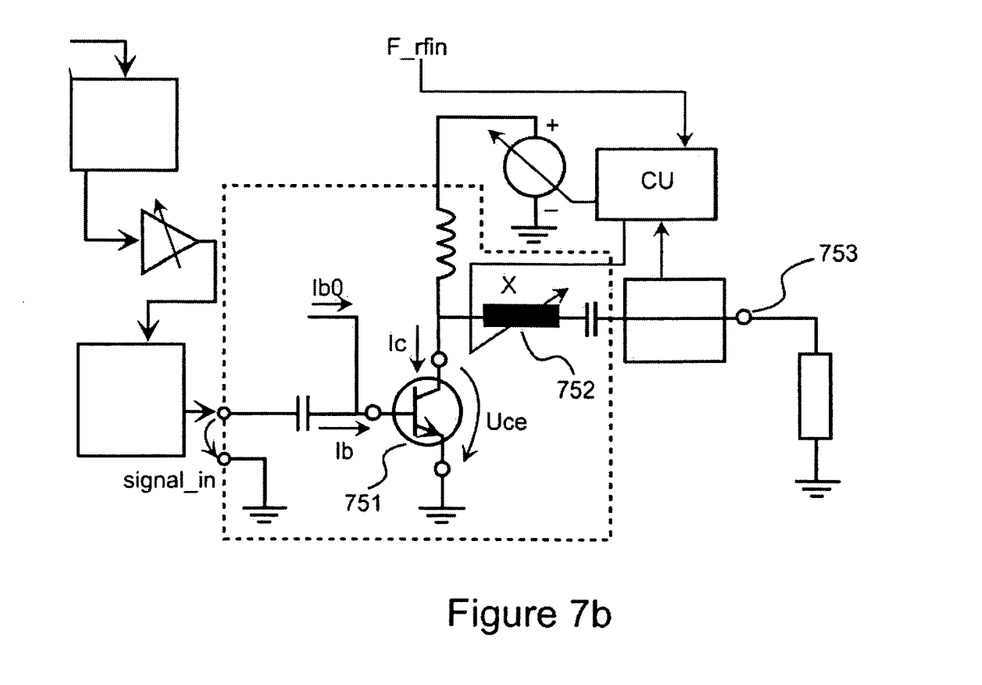

FIG. 7b shows a transmitter according to an embodiment of the invention. This embodiment of the invention is otherwise similar to the embodiment shown in FIG. 7a but an adjustable reactance element 752 is a serial circuit component in a signal path from an output stage transistor 751 to a signal output interface 753 and the output stage transistor 751 is a bipolar transistor.

Figure 8A:
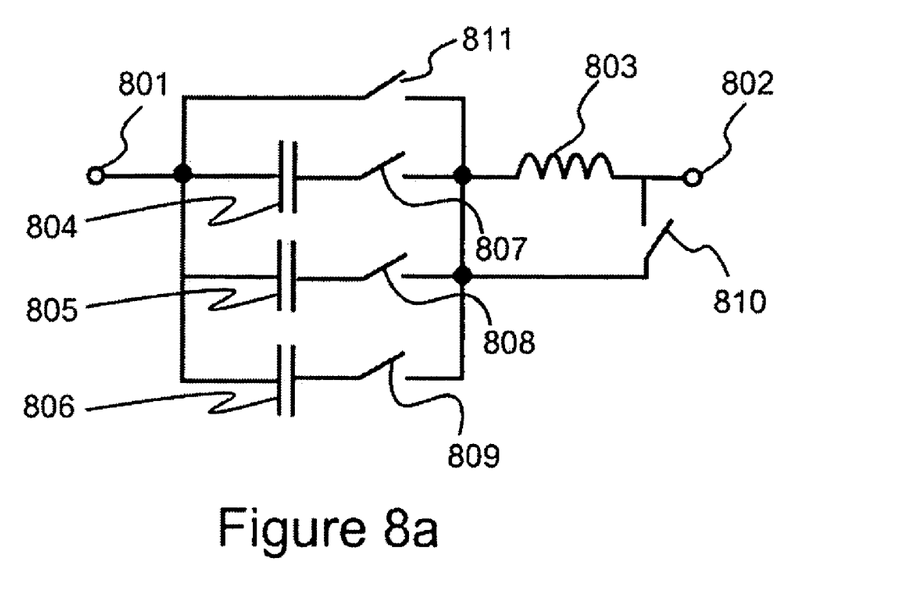
FIGS. 8a and 8b show examples of adjustable reactance elements that can be used in a transmitter according to an embodiment of the invention.
Figure 8B:
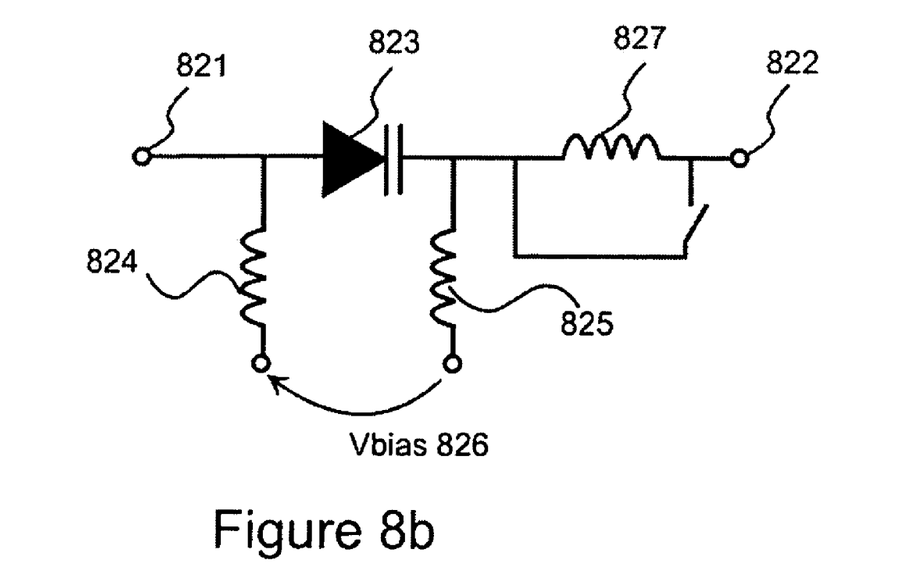

FIGS. 8a and 8b show examples of adjustable reactance elements that can be used in a power amplifier according to an embodiment of the invention. FIG. 8a presents an adjustable reactance element that has an inductor 803 and three capacitors 804, 805, 806. Reactance that is seen between terminals 801 and 802 can be adjusted with switches 807-811. A maximum value of reactance between terminals 801 and 802 is $\omega L$, where $\omega$ is $2\pi \times$frequency and L is inductance of the inductor 803. A minimum value of reactance is $-1/(\omega(C1+C2+C3))$, where C1, C2, and C3 are capacitances of the capacitors 804, 805, and 806, respectively. The switches can be e.g. FET-type transistors. A capacitor-switch combination can also be realized as a microelectromechanical (MEMS) capacitor. FIG. 8b shows an adjustable reactance element in which reactance between terminals 821 and 822 is adjustable in a continuous manner. The adjustable reactance element comprises a capacitor diode 823. Capacitance of the capacitor diode is determined with biasing dc-voltage 836 that is coupled to terminals of the capacitor diode via ac-decoupling inductors 824 and 825. Positive reactance values can be accomplished with an inductor 827.

Figure 9:
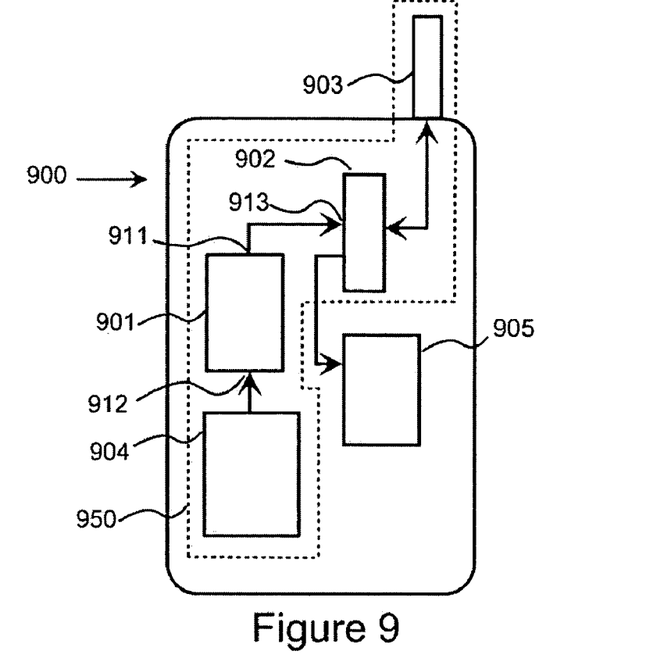
FIG. 9 shows a mobile communication device according to an embodiment of the invention.

FIG. 9 shows a mobile communication device according to an embodiment of the invention. A transmitter 950 of the mobile communication device 900 comprises a power amplifier, control means, and sensor means 901 according to any of the embodiments described above and with the aid of FIGS. 3-8. With control means described in conjunction with the embodiment shown in FIG. 3c there is no need for sensor means for detecting impedance mismatch. A signal output interface 911 of the power amplifier is coupled to an antenna 903 via a duplexer and antenna front-end element 902. Therefore, a signal input interface 913 of the duplexer and antenna front-end element 902 constitutes a load of the power amplifier. A block 904 represents all the parts of the mobile communication device that provides an RF-input signal to a signal input interface 912 of the power amplifier, e.g. a microphone, an analog-to-digital converter, a codec, an up-modulator, etc. Furthermore, the mobile communication device 900 comprises a controllable gain unit that compensates changes in a gain of the power amplifier caused by changes in an operating point of an output stage transistor of the power amplifier in conjunction with optimizing impedance matching between the signal output interface 911 and the signal input interface 913 according to the invention. The gain compensator can be located in the block 904 or it can be integrated with the power amplifier. A block 905 represents all the parts of the mobile communication device that process a signal received from the antenna 903 via the duplexer and antenna front-end element 902, e.g. a modulator, a demodulator, equalizers, filtering systems, controllers, a speaker, etc. The mobile communication device 900 can be e.g. a mobile phone.

A set of integrated circuits according to the invention comprises one or more integrated circuits (IC) that include a power amplifier having at least one output stage transistor between a signal input interface of the power amplifier and a signal output interface of the power amplifier, control means disposed to optimize an impedance match between an output impedance of the power amplifier and an input impedance of a load coupled to the signal output interface of the power amplifier by adjusting an operating point of the output stage transistor, and a controllable gain unit disposed to substantially compensate variations in a gain of the output stage transistor due to changes in the operating point of the output stage transistor.

Figure 10:
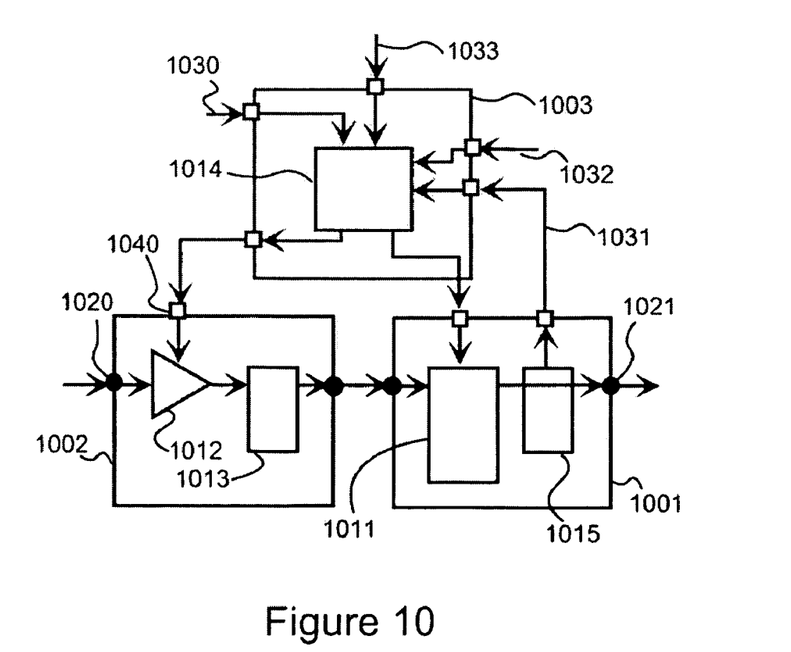
FIG. 10 shows an example of a set of integrated circuits according to an embodiment of the invention.

An example of a set of integrated circuits according to an embodiment of the invention is shown in FIG. 10. This exemplary chip-set comprises three integrated circuits 1001, 1002, and 1003. The integrated circuit 1001 includes a power amplifier 1011 according to any of the embodiments described above and with the aid of FIGS. 3-8, the integrated circuit 1002 includes a controllable gain unit 1012 and an up-modulator 1013, and the integrated circuit 1003 includes control means 1014 according to any of the embodiments described above and with the aid of FIGS. 3-8. Depending on the type of the control means the integrated circuit 1001 can comprise also sensor means 1015. Signal interfaces on boundaries of the integrated circuit 1001, 1002, and 1003 are denoted by black circles and control interfaces are denoted by white squares. An input signal of the chip-set according to this embodiment is an analog base band signal 1020. Power of the input signal 1020 is adjusted with the controllable gain unit 1012. An output signal of the controllable gain unit can be modulated up to a higher frequency band with the up-modulator 1013. An output signal of the up-modulator is fed into a signal input interface of the power amplifier 1011. An output signal of the chip-set is an output signal of the power amplifier. The control means 1014 optimize impedance match between an output impedance of the power amplifier and an impedance loading a signal output interface of the power amplifier by adjusting an operating point of the output stage transistor according to frequency band information 1030 or according to a result 1031 measured by the sensor means from the output signal of the power amplifier or according to both of them 1030 and 1031. The control means 1014 adjust a gain of the controllable gain unit 1012 via a control interface 1040. The gain adjustment is based on an externally given power reference 1033 and the result 1031 given by the sensor means. The gain adjustment can also be based on an externally given information 1032 about the prevailing output power and on the externally given power reference 1033. The control means adjust the operating point of the output stage transistor via a control interface 1041. It should be noted that the exemplary set of integrated circuits shown in FIG. 10 represent only one example of allocating different functional elements to different integrated circuits.

Figure 11:
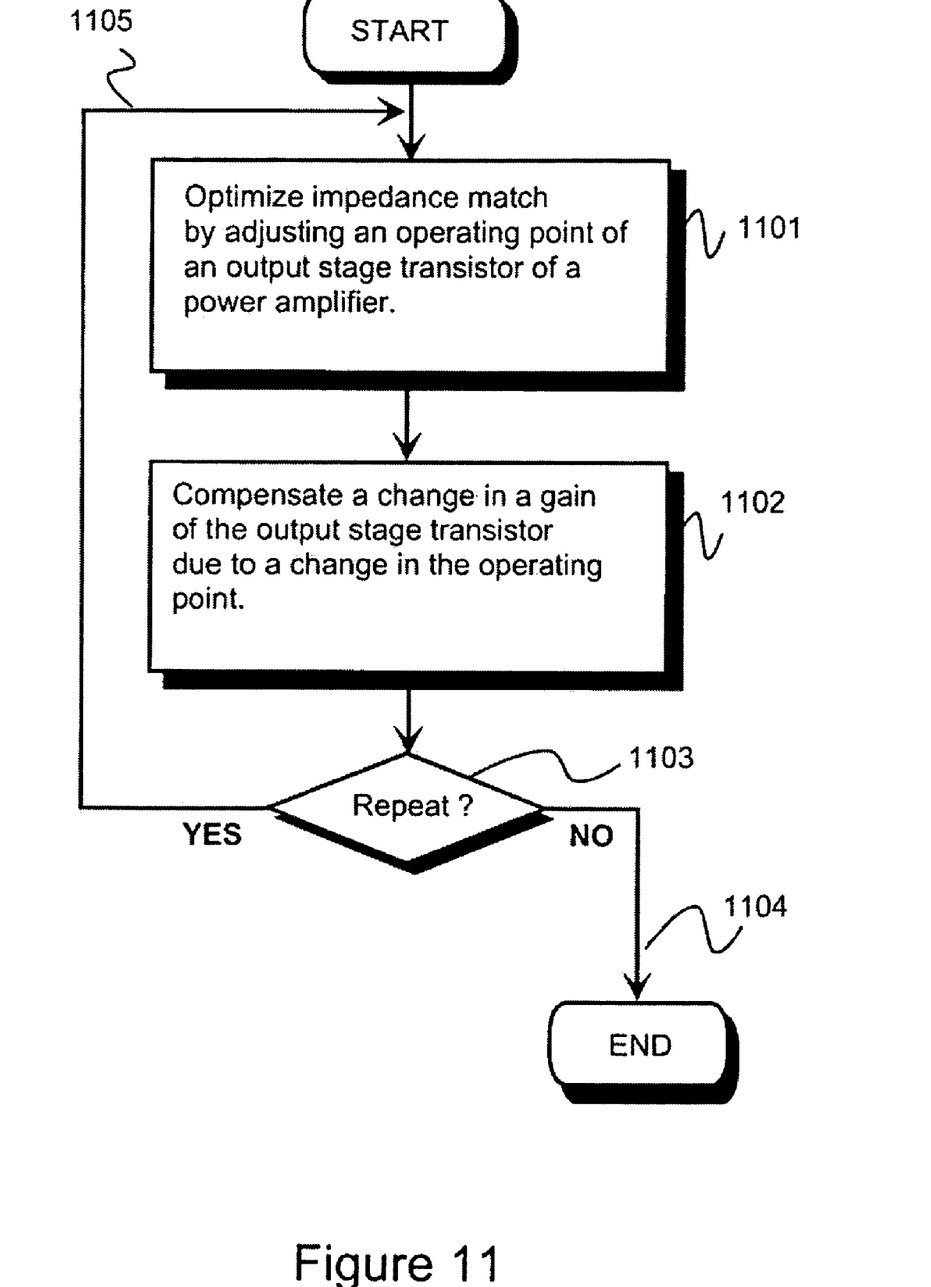
FIG. 11 shows a flow chart for a method for matching an output impedance of a power amplifier with an impedance of a load according to an embodiment of the invention.

FIG. 11 shows a flow chart for a method according to an embodiment of the invention for matching an output impedance of a power amplifier with an impedance loading a signal output interface of the power amplifier. In phase 1101 impedance match between the output impedance of the power amplifier and the impedance loading the signal output interface of the power amplifier is optimized by adjusting an operating point of an output stage transistor of the power amplifier. The optimization can be performed according to a result measured from output RF-signal of the power amplifier or according to frequency band information or according to both of them. The measuring may be performed e.g. with the aid of a directional switch. The measuring may also be performed with an arrangement that was described in conjunction with the embodiment of the invention shown in FIG. 3d. In phase 1102 a change in a gain of the output stage transistor due to a change in the operating point of the output stage transistor is compensated at least partly by adjusting power of an input signal of the power amplifier. The compensation is performed so that the output RF-power of the power amplifier is kept substantially in its reference value when the operation point of the output stage transistor is changed.

The optimal operating point can be searched e.g. by using the damped directed search method that was described in conjunction with the embodiment of the invention shown in FIG. 3*a*. The phase 1101 of the method may further comprise optimization of a value of an adjustable reactive element in order to improve impedance matching between the output impedance of the power amplifier and the impedance loading the power amplifier. This process can be repeated 1105 periodically at a desired pace in order to follow changing impedance conditions or the process can be terminated 1103, 1104.

It will be evident to any person skilled in the art that the invention and its embodiments are thus not limited to the above-described examples, but may vary within the scope of the independent claims.

What is claimed is:

1. A transmitter, comprising:
   a power amplifier having at least one output stage transistor coupled between a signal input interface of the power amplifier and a signal output interface of the power amplifier,
   an adjustable reactance element coupled to a signal output of said output stage transistor,
   a control configured to adjust an operating point of the output stage transistor and to adjust said adjustable reactance element to optimize an impedance match between an output impedance of the power amplifier and an impedance that is loading the signal output interface of the power amplifier, and
   controllable gain unit configured to substantially compensate variations in a gain of the output stage transistor caused by changes in the operating point of the output stage transistor.

2. A transmitter according to claim 1, wherein said control is configured to adjust the operating point of the output stage transistor by adjusting a supply dc-voltage of the power amplifier.

3. A transmitter according to claim 1, wherein said control is configured to adjust the operating point of the output stage transistor by adjusting a dc-component of supply current of the power amplifier.

4. A transmitter according to claim 1, wherein the transmitter comprises a sensor and wherein said control is configured to adjust the operating point of the output stage transistor at least partly according to a result measured by said sensor from an output signal of the power amplifier.

5. A transmitter according to claim 4, wherein said sensor comprises a directional switch.

6. A transmitter according to claim 1, wherein said control is configured to adjust the operating point of the output stage transistor at least partly according to frequency band information.

7. A transmitter, comprising:
   a power amplifier having at least one output stage transistor coupled between a signal input interface of the power amplifier and a signal output interface of the power amplifier,
   an adjustable reactance element coupled to a signal output of said output stage transistor,
   a control configured to adjust an operating point of the output stage transistor and to adjust said adjustable reactance element to optimize an impedance match between an output impedance of the power amplifier and an impedance that is loading the signal output interface of the power amplifier, and
   controllable gain unit configured to substantially compensate variations in a gain of the output stage transistor caused by changes in the operating point of the output stage transistor, wherein said control comprises a function element configured to return a value of the supply dc-voltage of the power amplifier as a response to a situation in which a value of a center frequency of an RF-signal received at the signal input interface of the power amplifier is given as an input value to said function element.

8. A transmitter according to claim 1, wherein the control comprises a switched-mode power supply unit.

9. A transmitter according to claim 1, wherein the power amplifier comprises a single ended output stage.

10. A transmitter according to claim 1, wherein the power amplifier comprises a push-pull type output stage.

11. A transmitter according to claim 1, wherein the output stage transistor is a bipolar transistor.

12. A transmitter according to claim 1, wherein the output stage transistor is a field effect transistor.

13. A mobile communication device, comprising:
   a power amplifier having at least one output stage transistor coupled between a signal input interface of the power amplifier and a signal output interface of the power amplifier,
   an adjustable reactance element coupled to a signal output of said output stage transistor,
   a control configured to adjust an operating point of the output stage transistor and to adjust said adjustable reactance element to optimize impedance match between an output impedance of the power amplifier and an impedance that is loading the signal output interface of the power amplifier, and
   controllable gain unit configured to substantially compensate variations in a gain of the output stage transistor caused by changes in the operating point of the output stage transistor.

14. A mobile communication device according to claim 13, wherein the mobile communication device is a mobile phone.

15. A set of integrated circuits, which comprises the following elements realized in one or more integrated circuit:
   a power amplifier having at least one output stage transistor between a signal input interface of the power amplifier and a signal output interface of the power amplifier,
   an adjustable reactance element coupled to a signal output of said output stage transistor,
   control means configured to adjust an operating point of the output stage transistor and to adjust said adjustable reactance element to optimize impedance match between an output impedance of the power amplifier and an impedance that is loading the signal output interface of the power amplifier; and
   a controllable gain unit configured to substantially compensate variations in a gain of the output stage transistor caused by changes in the operating point of the output stage transistor.

16. A set of integrated circuits according to claim 15, wherein said adjustable reactance element is for improving impedance matching between the output impedance of the power amplifier and the impedance that is loading the signal output interface of the power amplifier.

17. A method for matching an output impedance of a power amplifier with an impedance that is loading a signal output interface of the power amplifier, comprising:

adjusting an operating point of an output stage transistor of the power amplifier and a value of an adjustable impedance of the power amplifier to optimize an impedance match between the output impedance of the power amplifier and the impedance that is loading the signal output interface of the power amplifier, and compensating at least partly a change in a gain of the output stage transistor caused by a change in the operating point of the output stage transistor by adjusting power of an input signal of the power amplifier.

18. A method according to claim 17, wherein the adjusting the operating point of the output stage transistor of the power amplifier is performed by adjusting a supply dc-voltage of the power amplifier.

19. A method according to claim 17, wherein the adjusting the operating point of the output stage transistor of the power amplifier is performed by adjusting a dc-component of supply current of the power amplifier.

20. A method according to claim 17, wherein the adjusting the operating point of the output stage transistor of the power amplifier is performed at least partly according to a result measured from an output signal of the power amplifier.

21. A method according to claim 17, wherein the adjusting the operating point of the output stage transistor of the power amplifier is accomplished by finding an operating point that optimizes the impedance match by using a damped directed search method.

22. A method according to claim 17, wherein the adjusting the operating point of the output stage transistor of the power amplifier is performed at least partly according to frequency band information.

23. A method according to claim 17, wherein the method is repeated periodically at a desired pace.

* * * * *